United States Patent
Majumder

(10) Patent No.: US 11,251,619 B2
(45) Date of Patent: Feb. 15, 2022

(54) CONTROL OF MULTIPLE ENERGY STORAGES IN A MICROGRID

(71) Applicants: ABB Schweiz AG, Baden (CH); Hitachi Energy Switzerland AG, Baden (CH)

(72) Inventor: Ritwik Majumder, Västerås (SE)

(73) Assignees: Hitachi Energy Switzerland AG, Baden (CH); ABB Schweiz AG, Baden (CH)

( * ) Notice: Subject to any disclaimer, the term of this patent is extended or adjusted under 35 U.S.C. 154(b) by 0 days.

(21) Appl. No.: 16/618,666

(22) PCT Filed: Jun. 1, 2017

(86) PCT No.: PCT/EP2017/063387
§ 371 (c)(1),
(2) Date: Dec. 2, 2019

(87) PCT Pub. No.: WO2018/219468
PCT Pub. Date: Dec. 6, 2018

(65) Prior Publication Data
US 2020/0235578 A1    Jul. 23, 2020

(51) Int. Cl.
*H02J 3/28* (2006.01)
*G05B 19/042* (2006.01)
(Continued)

(52) U.S. Cl.
CPC ............ *H02J 3/28* (2013.01); *G05B 19/0423* (2013.01); *H02J 3/381* (2013.01); *H02J 3/388* (2020.01);
(Continued)

(58) Field of Classification Search
CPC ........ H02J 3/28; H02J 3/388; H02J 13/00002; H02J 3/381; G05B 19/0423;
(Continued)

(56) References Cited

U.S. PATENT DOCUMENTS

| 8,315,745 B2 | 11/2012 | Creed |
| 8,831,788 B2 | 9/2014 | Flynn et al. |

(Continued)

FOREIGN PATENT DOCUMENTS

| CN | 103956738 A | 7/2014 |
| CN | 105845005 A | 8/2016 |

(Continued)

OTHER PUBLICATIONS

International Preliminary Report on Patentability Application No. PCT/EP2017/063387 Completed: May 27, 2019 15 Pages.

(Continued)

*Primary Examiner* — Kenneth M Lo
*Assistant Examiner* — Mohammed Shafayet
(74) *Attorney, Agent, or Firm* — Slater Matsil, LLP

(57) ABSTRACT

A method performed by a network controller of an electrical microgrid having a plurality of energy storages. Each of the energy storages is associated with a respective storage controller. The method includes receiving information about a measurement made at a remote location in the microgrid. The method also includes obtaining respective participation factors in respect of the remote location for each of at least a first energy storage and a second energy storage of the plurality of energy storages. The method also includes obtaining respective states of charge for each of the at least first and second energy storages. The method also includes, for each of the at least first and second energy storages, calculating a reference value for the energy storage, and sending the reference value to the storage controller with which the energy storage is associated. The calculating includes calculating the reference value based on the obtained participation factors and the obtained states of charge.

20 Claims, 4 Drawing Sheets

(51) Int. Cl.
*H02J 3/38* (2006.01)
*H02J 13/00* (2006.01)

(52) U.S. Cl.
CPC ............... *H02J 13/00002* (2020.01); *G05B 2219/21087* (2013.01); *G05B 2219/24215* (2013.01)

(58) Field of Classification Search
CPC .......... G05B 2219/21087; G05B 2219/24215; Y02E 40/70; Y04S 10/12; Y02P 80/14; G01R 19/2513
USPC .......................................................... 700/298
See application file for complete search history.

(56) References Cited

U.S. PATENT DOCUMENTS

| | | | |
|---|---|---|---|
| 8,946,929 B2 | 2/2015 | Singh et al. | |
| 9,620,960 B2 | 4/2017 | Majumder | |
| 9,762,066 B2 | 9/2017 | Majumder | |
| 2001/0012211 A1* | 8/2001 | Hasegawa | H02P 9/105 363/131 |
| 2012/0299305 A1* | 11/2012 | Brogan | H02J 3/381 290/55 |
| 2014/0100705 A1* | 4/2014 | Shi | H02J 3/381 700/293 |
| 2014/0103727 A1* | 4/2014 | Taimela | H02J 3/28 307/76 |
| 2014/0324369 A1* | 10/2014 | Yang | G01R 31/086 702/59 |
| 2015/0244209 A1* | 8/2015 | Suehiro | H02J 3/381 307/65 |
| 2016/0118795 A1* | 4/2016 | Berkowitz | H02J 3/1807 700/286 |
| 2016/0266559 A1* | 9/2016 | Shi | H02J 3/40 |
| 2016/0274607 A1* | 9/2016 | Kudo | G05F 1/625 |
| 2017/0005515 A1 | 1/2017 | Sanders et al. | |

FOREIGN PATENT DOCUMENTS

| | | |
|---|---|---|
| CN | 105900309 A | 8/2016 |
| CN | 106463965 A | 2/2017 |

OTHER PUBLICATIONS

International Search Report and Written Opinion of the International Searching Authority Application No. PCT/EP2017/063387 Completed: Feb. 8, 2018; dated Apr. 11, 2018 17 Pages.

* cited by examiner

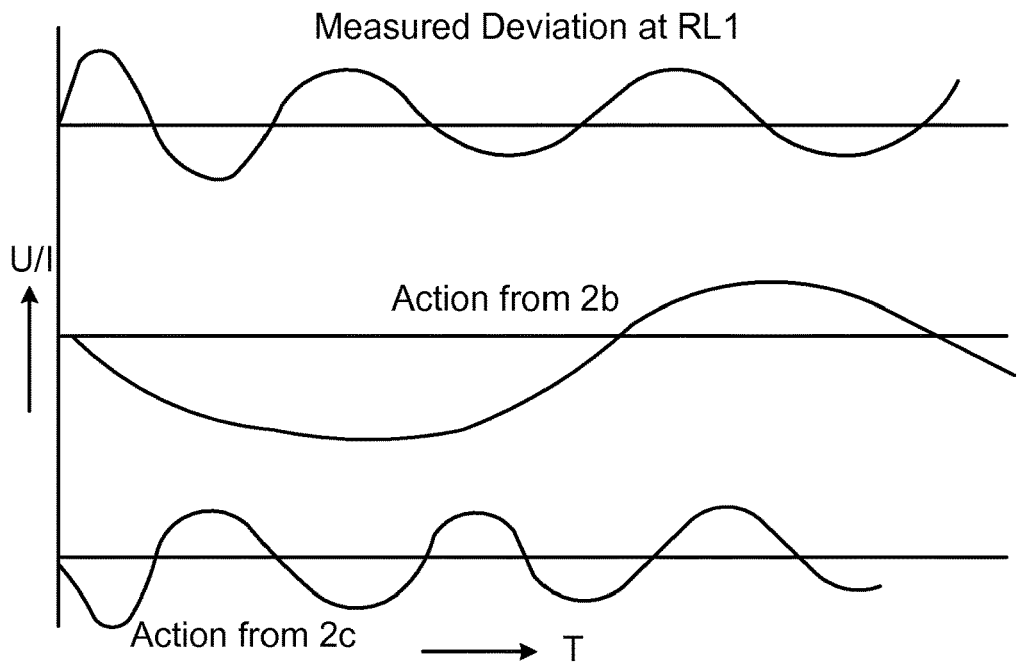
Fig. 5
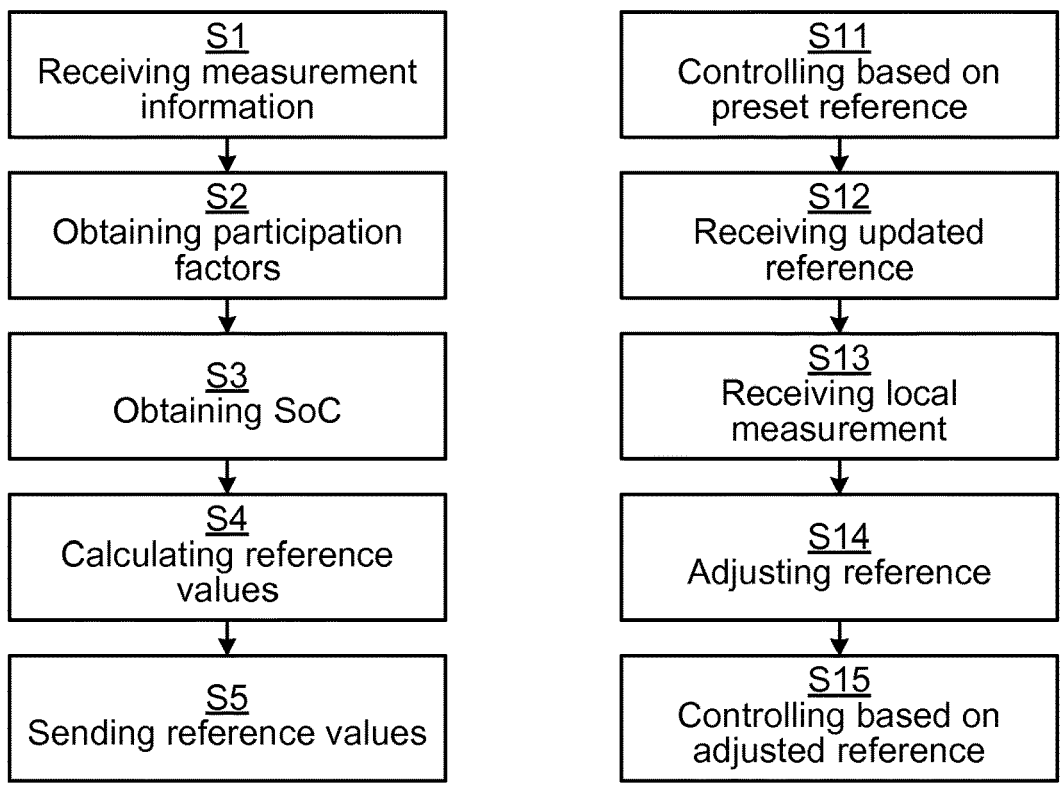
Fig. 6
Fig. 7

CONTROL OF MULTIPLE ENERGY STORAGES IN A MICROGRID

TECHNICAL FIELD

The present disclosure relates to a methods and devices for controlling a plurality of energy storages in a microgrid.

BACKGROUND

A microgrid is a localized grouping of distributed generators (DG), energy storage, and loads that normally operates connected to a traditional centralized grid (macrogrid) via a point of common coupling (PCC). This single point of common coupling with the macrogrid can be disconnected, islanding the microgrid. Microgrids are part of a structure aiming at producing electrical power locally from many small energy sources, DGs. In a microgrid, a DG is often connected via a converter which controls the output of the DG, i.e. the power injected into the microgrid.

Energy storages can provide energy or power within a microgrid depending on the need. A microgrid requires a high energy storage for supplying power balance for longer time, and stability is improved with a high power storage. In a microgrid, system stability is improved with application of an energy storage for continuous real and reactive power injection which also acts as a stabilizer for the microgrid. The main control philosophy for such stabilizing action is real and reactive power injection based on local frequency and voltage deviation, respectively.

In most scenarios, a larger storage/stabilizer is economical. However, in a microgrid, depending on growth, expansion and with higher penetration of DGs, it may be required to add a new storage/stabilizer in an existing microgrid, which leads to multiple storage scenarios. Moreover, a planned multiple stabilizer scenario can also be beneficial for a microgrid with critical loads and frequency dependencies.

In a microgrid having a plurality of energy storages, it is necessary to decide which storage should be used to act in view of an obtained measurement, e.g. voltage or frequency measurement.

U.S. Pat. No. 8,946,929 discloses a microgrid comprising a plurality of energy storages, each connected to either of a direct current (DC) bus and an alternating current (AC) bus. Each energy storage has a local controller which keeps track of the State of Charge (SoC) and health of its storage and which is connected with a master microgrid controller via an energy storage system bus. The document is concerned with properly determining SoC to avoid overcharging or overdischarging the storage, thereby preserving its health and prolonging its lifespan. A master microgrid controller may perform charge/discharge operation for the subordinate energy storage components based upon the microgrid power status and the SoC and state of health status of the energy storage components.

SUMMARY

An objective of the present invention is to provide a method for dynamic participation of energy storages in a microgrid during power imbalances in a microgrid.

According to an aspect of the present invention, there is provided a method performed by a network controller of an electrical microgrid comprising a plurality of energy storages. Each of the energy storages is associated with a respective storage controller. The method comprises receiving information about a measurement made at a remote location (RL) in the microgrid. The method also comprises obtaining respective participation factors in respect of the remote location for each of at least a first energy storage and a second energy storage of the plurality of energy storages. The method also comprises obtaining respective states of charge of each of said at least first and second energy storages. The method also comprises, for each of the at least first and second energy storages, calculating a reference value for the energy storage, and sending the reference value to the storage controller with which the energy storage is associated. The calculating comprises calculating the reference value based on the obtained participation factors and the obtained states of charge.

According to another aspect of the present invention, there is provided a computer program product comprising computer-executable components for causing a network controller to perform an embodiment of a method of the present disclosure when the computer-executable components are run on processing circuitry comprised in the storage controller.

According to another aspect of the present invention, there is provided a network controller for an electrical microgrid comprising a plurality of energy storages. Each of the energy storages is associated with a respective storage controller. The network controller comprises processing circuitry, and storage storing instructions executable by said processing circuitry whereby said network controller is operative to receive information about a measurement made at a remote location in the microgrid. The network controller is also operative to obtain respective participation factors in respect of the remote location for each of at least a first energy storage and a second energy storage of the plurality of energy storages. The network controller is also operative to obtain respective states of charge of each of said at least first and second energy storages. The network controller is also operative to, for each of the at least first and second energy storages, calculate a reference value for the energy storage, and send the reference value to the storage controller with which the energy storage is associated. The calculating comprises calculating the reference value based on the obtained participation factors and the obtained states of charge.

According to another aspect of the present invention, there is provided a method performed by a storage controller associated with an energy storage in an electrical microgrid. The method comprises controlling the energy storage based on a preset reference value. The method also comprises, from a network controller of the microgrid, receiving an updated reference value. The method also comprises receiving information about a measurement made at a local location (LL). The method also comprises adjusting the preset reference value based on both the received updated reference value and the received measurement information. The method also comprises controlling the energy storage based on the adjusted reference value.

According to another aspect of the present invention, there is provided a computer program product comprising computer-executable components for causing a storage controller to perform an embodiment of a method of the present disclosure when the computer-executable components are run on processing circuitry comprised in the storage controller.

According to another aspect of the present invention, there is provided a storage controller configured for being associated with an energy storage in an electrical microgrid. The storage controller comprises processing circuitry, and storage storing instructions executable by said processing circuitry whereby said storage controller is operative to control the energy storage based on a preset reference value. The storage controller is also operative to, from a network controller of the microgrid, receive an updated reference value. The storage controller is also operative to receive information about a measurement made at a local location. The storage controller is also operative to adjust the preset reference value based on both the received updated reference value and the received measurement information. The storage controller is also operative to control the energy storage based on the adjusted reference value.

According to another aspect of the present invention, there is provided an electrical power microgrid comprising an embodiment of a network controller of the present disclosure and a plurality of storage controllers in accordance with an embodiment of the present disclosure.

By means of respective participation factors, a plurality of energy storages in the microgrid can be controlled by the central network controller, via local storage controllers, to react to a measurement obtained from a remote location (i.e. a location which is not local to an energy storage) in the microgrid. A participation factor may e.g. be regarded as the impact of active power injection from a first energy storage on the frequency deviation measured at the remote location or influence of reactive power injection from a second energy storage on the voltage measured at the remote location. The participation factors may alternatively/additionally be related to the influence on the dominant mode (lower frequency system oscillations) from the first energy storage active power injections or second energy storage reactive power injection for example.

The SoC of the respective energy storages is obtained to ensure that the energy storages hold enough energy/power to perform the action implied by the participation factors. If the SoC of an energy storage is too high or too low for the action of that energy storage implied by the participation factors, the calculating of the reference values are adjusted accordingly. Otherwise, if the SoC is not an issue for performing the actions implied by the participation factors, this is noted and the reference values are not adjusted in view of the SoC when they are calculated.

It is to be noted that any feature of any of the aspects may be applied to any other aspect, wherever appropriate. Likewise, any advantage of any of the aspects may apply to any of the other aspects. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc.", are to be interpreted openly as referring to at least one instance of the element, apparatus, component, means, step, etc., unless explicitly stated otherwise. The steps of any method disclosed herein do not have to be performed in the exact order disclosed, unless explicitly stated. The use of "first", "second" etc., for different features/components of the present disclosure are only intended to distinguish the features/components from other similar features/components and not to impart any order or hierarchy to the features/components.

BRIEF DESCRIPTION OF THE DRAWINGS

Embodiments will be described, by way of example, with reference to the accompanying drawings, in which:

FIG. 1b is a schematic block diagram of an embodiment of a control arrangement for the microgrid of FIG. 1a.

FIG. 5 is a schematic graph illustrating how a (e.g. voltage or current) deviation measured at a remote location in FIG. 4 can be counteracted by controlling two different energy storages to perform different actions.

FIG. 6 is a schematic flow chart of an embodiment of a method performed by the network controller, in accordance with the present invention.

FIG. 7 is a schematic flow chart of an embodiment of a method performed by a storage controller, in accordance with the present invention.

DETAILED DESCRIPTION

Embodiments will now be described more fully hereinafter with reference to the accompanying drawings, in which certain embodiments are shown. However, other embodiments in many different forms are possible within the scope of the present disclosure. Rather, the following embodiments are provided by way of example so that this disclosure will be thorough and complete, and will fully convey the scope of the disclosure to those skilled in the art. Like numbers refer to like elements throughout the description.

The ability of an energy storage to participate in system dynamics in a microgrid depends on its controllability, and is in prior art usually determined based on available energy (SoC) of the energy storage. Measurement based injections of power from the energy storage into the microgrid are usually activated based on a detected deviation of a system parameters (e.g. frequency, voltage, current etc.). In accordance with the present disclosure, a common signal or measurement deviation is used to decide individual storage actions [e.g. power injection profiles, grid forming, VSM (Virtual Synchronous Machine) operation] for each energy storage. The actions are generated based on calculated participation factors of the storages for the measured location and (optionally) status of the breakers connecting the energy storages in the microgrid and/or connecting the microgrid at a PCC. The SoC of the respective energy storages are monitored in order to ensure that the available stored energy is adequate for performing the action (injection or absorption of electrical energy) implied by the participation factors.

Figure 1A:
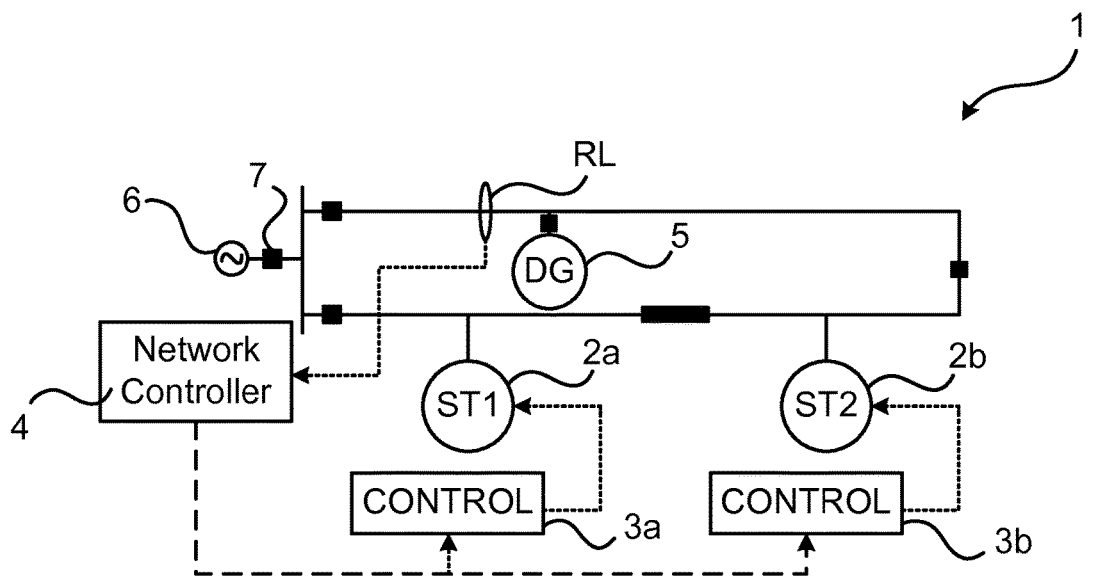
FIG. 1a is a schematic circuit diagram of an embodiment of a microgrid, with storage control based on a remote measurement, in accordance with the present invention.

FIG. 1a illustrates an embodiment of a microgrid 1 comprising a plurality of energy storages 2, here a first energy storage 2a and a second energy storage 2b. Each energy storage 2 is associated with (controlled by) a local storage controller 3, i.e. a first storage controller 3a for the first energy storage 2a and a second storage controller 3b for the second energy storage 2b. The microgrid also typically comprises at least one DG 5, optionally any number of loads (not shown), and circuit breakers, including a circuit breaker 7 at the PCC with another power grid 6, e.g. an AC grid such as a power distribution grid, or another microgrid.

A central network controller 4 is arranged for controlling the microgrid 1, e.g. by sending reference values to the storage controllers for updating their respective references (e.g. voltage, frequency, current and/or power references). As indicated by the dotted line in the figure, the network controller 4 obtains information about a measurement (e.g. voltage, frequency, current and/or power measurement) made at a remote location RL in the microgrid 1. That the RL is remote indicates that the location is not local to one of the energy storages 2, e.g. at the point where the energy storage is connected in the microgrid. Examples of remote locations include, but are not limited to, a location at a point where a DG 5 or load is connected in the microgrid, or a location at a PCC or breaker 7 in the microgrid. As indicated by the dashed lines in the figure, the network controller 4 may then send control signals to the respective storage controllers 3, comprising reference values, for centrally controlling the energy storages 2 based on the measurement at the RL. The reference values of the control signals may in other embodiments be based on any number of measurements at any number of remote locations.

Figure 1B:
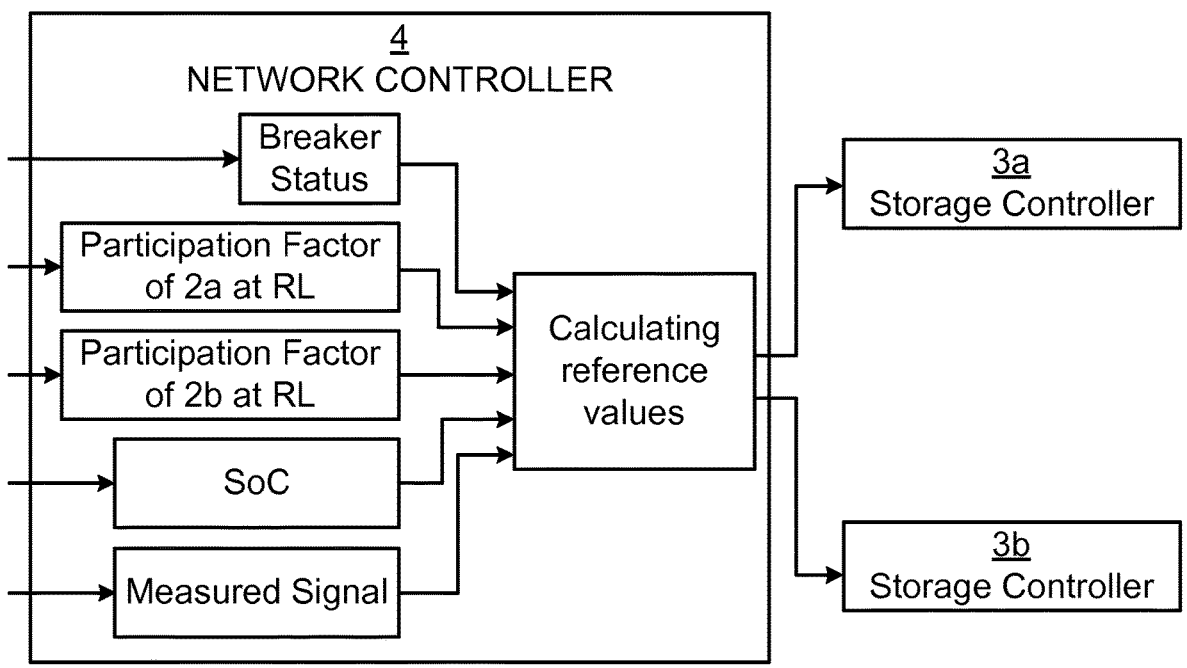

FIG. 1b illustrates examples of input and output signals of a network controller 4 in a control arrangement which also comprises the storage controllers 3, here first and second storage controllers 3a and 3b, of a microgrid, e.g. the microgrid illustrated in FIG. 1a. The input comprises information about the measurement at the remote locations, and may also comprise any of:

SoC of the first and second energy storages 2a and 2b, e.g. received from the first and second storage controllers 3a and 3b which may monitor the SoC of their respective associated energy storage 2a and 2b. The SoC of the respective energy storages are monitored in order to ensure that the available stored energy is adequate for performing the action (injection or absorption of electrical energy) implied by the participation factors.

The respective participation factors, e.g. dynamically calculated, of the first and second storages 2a and 2b in respect of the RL. Based on the network connection, microgrid assets (e.g. loads and DGs 5) and network controller parameters, the participation factor regarding each RL is calculated for each measured parameter (e.g. voltage, frequency, current and/or power, corresponding to control modes such as voltage, frequency, current and/or power control mode) against change in storage references (or states e.g. output current, voltage etc.). These may be calculated at the microgrid operating system and communicated to the network controller 4. Alternatively, in some embodiments of the present invention, the participation factors are calculated, or otherwise determined, in by the network controller. As another alternative, each storage controller 3 may calculate the participation factor of its associated energy storage, e.g. in terms of peak power injection, oscillation frequency, energy etc. Each storage controller 3 can calculate participation factors for each RL used.

Status of breakers in the microgrid, e.g. the breaker 7 at the PCC which may indicate whether the microgrid is islanded or not. Also the status (e.g. open or closed) of other breakers in the microgrid may be relevant to the ability of each storage 2 to affect the measured property at the RL. The breaker status information can be fed to the network controller 4 directly from the relay or through the microgrid operating system e.g. a supervisory control and data acquisition (SCADA) operating system.

By means of data storage and processing circuitry of the network controller 4, the network controller may then use the inputted information to calculate respective reference values for each of the first and second energy storages 2a and 2b. Control signals comprising the respective reference values are outputted (sent) to each respective first and second storage controller 3a and 3b.

Figure 2:
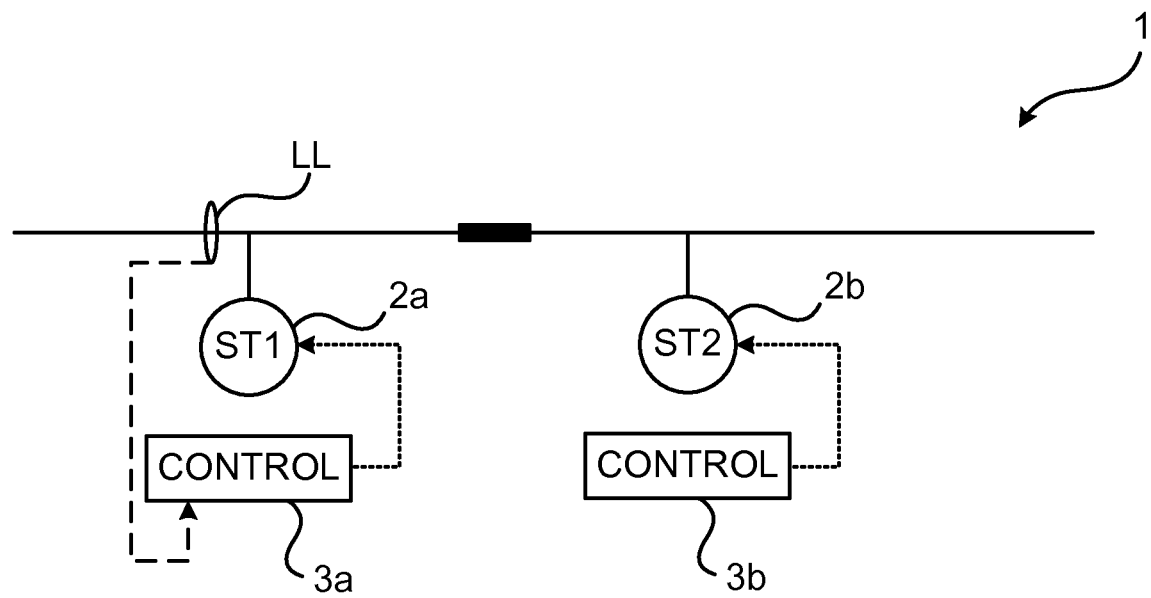
FIG. 2 is a schematic circuit diagram of an embodiment of a microgrid, with storage control based on a local measurement, in accordance with the present invention.

FIG. 2 illustrates an embodiment of a part of a microgrid 1 in which information about a local measurement at a local location LL at the first storage 2a is obtained by the first storage controller 3a, directly i.e. not via the network controller 4. That a storage controller 3 controls its associated energy storage 2 based on control signals from the network controller 4 relating to a measurement at a remote location RL does not preclude that the storage controller 3 may also control the energy storage 2 based on locally obtained measurement(s) from a local location LL, e.g. at a point where the energy storage 2 is connected in the microgrid 1. The storage controller 3 may thus adjust its reference based on both the local measurement and on the remote measurement (by means of the control signal from the network controller 4). A local signal deviation as measured at a LL may have higher priority than a signal deviation at a RL. Such a deviation may be corrected based on the local measurements. This avoids delays in corrective actions for larger disturbance near the storage device.

EXAMPLE 1

Selection of Real and Reactive Power Injections

With reference to FIG. 1a, a decreasing power output of the DG 5, e.g. while the microgrid 1 is islanded, is detected with a slow fall of voltage and frequency as measured at the RL. Before this decreasing power output results in tripping and load shedding relays or other protective equipment, energy storages 2a and 2b are employed to restore voltage and frequency of the microgrid. According to an embodiment of the present invention, the network controller 4 calculates reference values for participation of the first and second energy storages 2a and 2b and decides on e.g. changes in real power injection from the first energy storage 2a while the reactive power support is provided by the second energy storage 2b.

EXAMPLE 2

Selection of Grid Forming Energy Storages

Figure 3:
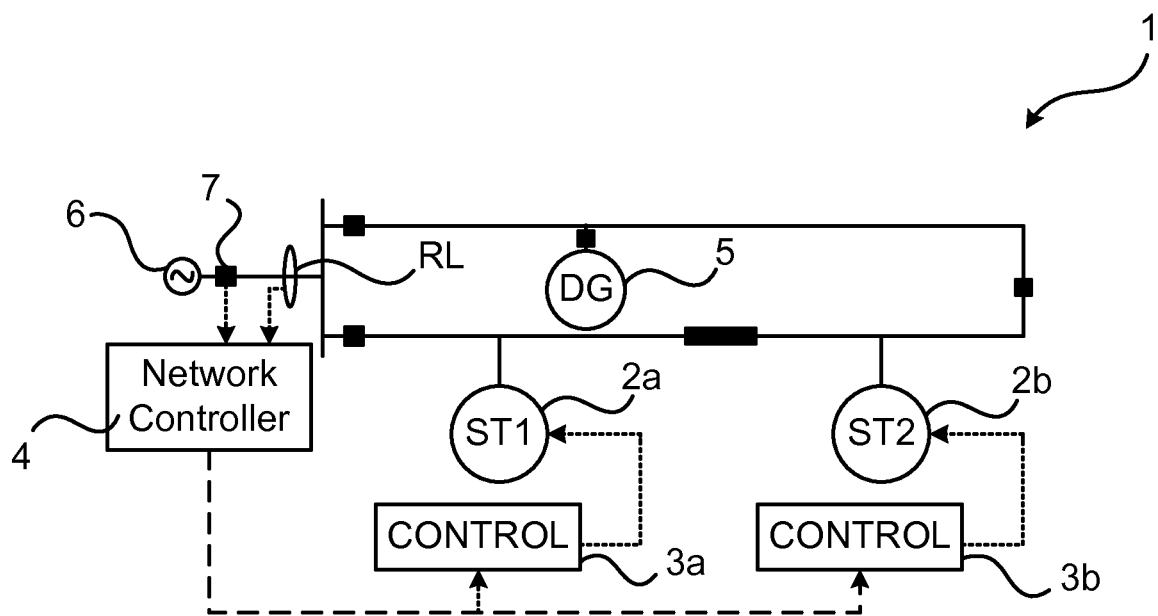
FIG. 3 is a schematic circuit diagram of an embodiment of a microgrid, with storage control based on a measurement at the PCC, in accordance with the present invention.

With reference to FIG. 3, following a fault and/or during islanding, detected at the PCC breaker 7, the network controller 4 calculates reference values for the first and second energy storages 2a and 2b, resulting in that the second energy storage 2b, as controlled by the second storage controller 3b, changes mode to grid forming mode while the first energy storage 2a, as controlled by the first storage controller 3a, remains in its present mode e.g. voltage control mode. This could be decided due to location of the loads and SoC of the respective storages 2a and 2b. For large and foreseeable disturbances, as when the microgrid is islanded, the reference values may be precalculated for immediate implementations.

EXAMPLE 3

Selection of Energy Storages for Damping Control

Figure 4:
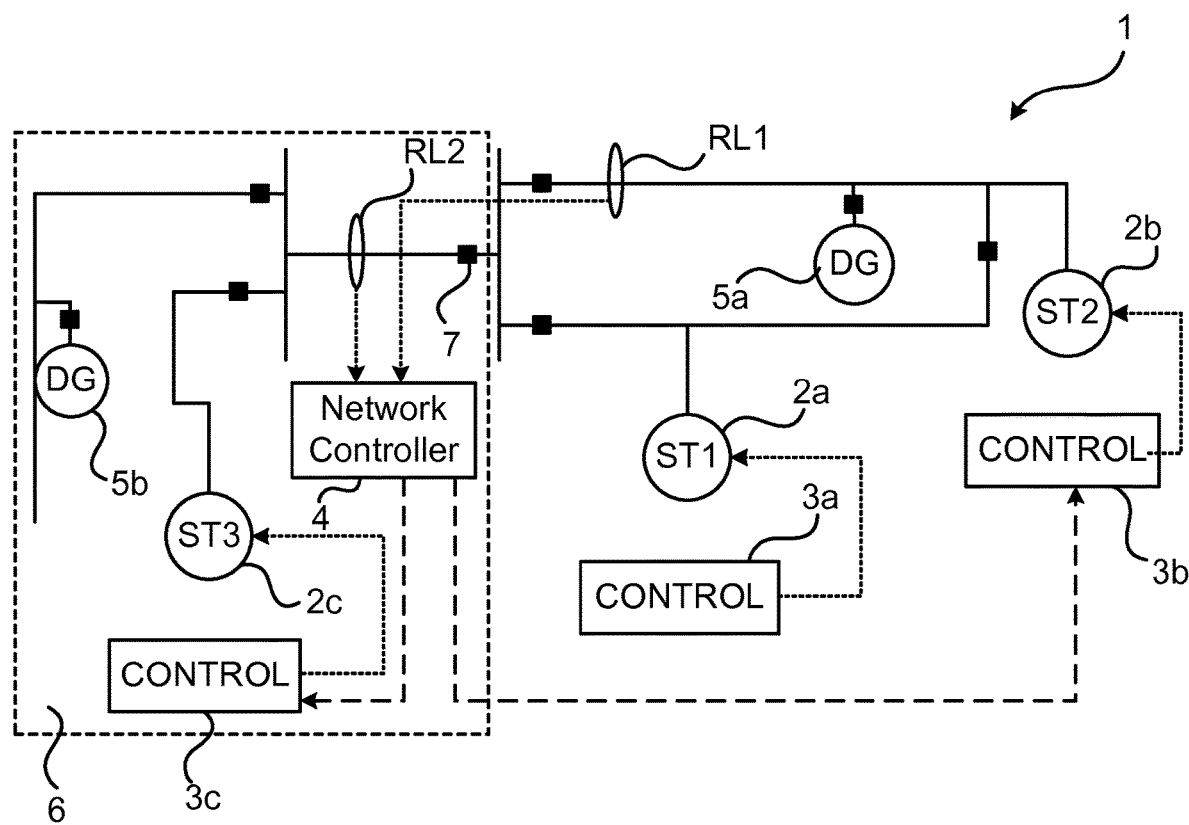
FIG. 4 is a schematic circuit diagram of an embodiment of a microgrid connected to another microgrid, with storage control based on remote measurements, in accordance with the present invention.

With reference to FIG. 4, in which the power grid 6 with which the microgrid 1 is connected at the PCC 7 is another microgrid, the network controller 4 which controls both microgrids 1 and 6 calculates reference values for energy storages 2 of both microgrids 1 and 6, resulting in the selection of the second energy storage 2b of microgrid 1 and the third energy storage 2c of the power grid 6 for an inter area mode oscillation damping measured at the two remote locations RL1 and RL2 on either side of the PCC 7. The action performed by the second and third energy storages 2a and 2c could for instance be change in power injection at different frequencies, as illustrated in FIG. 5.

With reference to FIGS. 6 and 7, method embodiments of the present invention, performed in/by the network controller 4 or any or each of the storage controllers 3 are presented below.

FIG. 6 is a flow chart illustrating a method performed by a network controller 4 of the electrical power microgrid 1 comprising a plurality of energy storages 2. Each energy storage is associated with (controlled by) a respective storage controller 3. The method comprises receiving S1 information about a measurement made at a remote location RL in the microgrid. The method also comprises obtaining S2 respective participation factors in respect of the remote location for each of at least a first energy storage 2a and a second energy storage 2b of the plurality of energy storages. The method also comprises obtaining S3 respective states of charge of each of said at least first and second energy storages, to ensure the calculated S4 reference values based on system disturbance and participation factor of the storage can be archived (otherwise they are adjusted accordingly). The method also comprises, for each of the at least first and second energy storages 2a or 2b, calculating S4 a reference value for the energy storage and sending S5 the reference value to the storage controller 3a or 3b with which the energy storage is associated. The calculating S4 comprises calculating the reference value based on the obtained S2 participation factors and the obtained S3 states of charge.

FIG. 7 is a flow chart illustrating a method performed by a storage controller 3 associated with an energy storage 2 in the electrical microgrid 1. The method comprises controlling S11 the energy storage based on a preset reference value. The method also comprises, from a network controller 4 of the microgrid, receiving S12 an updated reference value. The method also comprises receiving S13 information about a measurement made at a local location LL. The method also comprises adjusting S14 the preset reference value based on both the received S12 updated reference value and the received S13 measurement information. The method also comprises controlling S15 the energy storage based on the adjusted S14 reference value.

The present disclosure has mainly been described above with reference to a few embodiments. However, as is readily appreciated by a person skilled in the art, other embodiments than the ones disclosed above are equally possible within the scope of the present disclosure, as defined by the appended claims.

The invention claimed is:

1. A method performed by a network controller of an electrical power microgrid comprising a plurality of energy storages, each energy storage being associated with a respective storage controller, the method comprising:

receiving information about a measurement, comprising a measurement of a voltage and a frequency made at a remote location within the microgrid, wherein the remote location is at a Point of Common Coupling, PCC, of the microgrid with an AC grid or at a location where a distributed generator, DG, is operatively connected to the microgrid;

obtaining respective participation factors in respect of the remote location for each of a first energy storage and a second energy storage of the plurality of energy storages, wherein a first participation factor for the first energy storage quantifies a deviation of the frequency measured at the remote location in response to active power injection from the first energy storage, and a second participation factor for the second energy storage quantifies a deviation of the voltage measured at the remote location in response to reactive power injection from the second energy storage, wherein the remote location is different from a location of the first energy storage and a location of the second energy storage;

obtaining respective states of charge of each of the first energy storage and the second energy storage;

calculating respective reference values for each of the first energy storage and the second energy storage; and sending the respective reference values to the respective storage controllers associated with the first energy storage and the second energy storage, wherein the calculating the respective reference values comprises calculating the respective reference values based on the obtained respective participation factors and the obtained respective states of charge.

2. The method of claim 1, wherein the calculating respective reference values includes calculating the respective reference values based also on received information about respective statuses of at least one circuit breaker in the microgrid.

3. The method of claim 1, wherein the obtained respective participation factors are used for current control mode and/or for voltage control mode of the microgrid.

4. The method of claim 1, wherein the obtaining of the respective participation factors includes receiving the respective participation factors from the respective storage controllers and/or from an operating system of the microgrid.

5. The method of claim 1, wherein the measurement indicates that the microgrid has been islanded.

6. The method of claim 1, wherein the measurement indicates lower frequency system oscillations from the active power injection from the first energy storage or from the reactive power injection from the second energy storage.

7. The method of claim 1, wherein, for each of the first energy storage and the second energy storage, the sent respective reference values are used by the respective storage controllers for controlling the respective energy storages.

8. A non-transitory machine readable medium having stored thereon a program having a program code for performing the method of claim 1, when the program is executed on at least one processor.

9. The method of claim 2, further comprising:

in response to determining that the at least one circuit breaker has islanded the microgrid from the AC grid, assigning the respective storage controller associated with the first energy storage to operate in a grid forming mode, and assigning the respective storage controller associated with the second energy storage to operate in a voltage control mode.

10. The method of claim 1, wherein the steps of receiving the information, obtaining the respective participation factors, obtaining the respective states of charge, calculating the respective reference values, and sending the respective reference values are performed when the microgrid is islanded from the AC grid.

11. A network controller for an electrical microgrid comprising a plurality of energy storages, each energy storage being associated with a respective storage controller, the network controller comprising:
processing circuitry; and
a storage storing instructions executable by said processing circuitry, wherein the instructions are configured to cause the network controller to:
receive information about a measurement, comprising a measurement of a voltage and a frequency made at a remote location within the microgrid, wherein the remote location is at a Point of Common Coupling, PCC, of the microgrid with an AC grid or at a location where a distributed generator, DG, is operatively connected to the microgrid;
obtain respective participation factors in respect of the remote location for each of a first energy storage and a second energy storage of the plurality of energy storages, wherein a first participation factor for the first energy storage quantifies a deviation of the frequency measured at the remote location in response to active power injection from the first energy storage, and a second participation factor for the second energy storage quantifies a deviation of the voltage measured at the remote location in response to reactive power injection from the second energy storage, wherein the remote location is different from a location of the first energy storage and a location of the second energy storage;
obtain respective states of charge of each of said first energy storage and second energy storage; and
calculate respective reference values for each of the first energy storage and the second energy storage; and
send the respective reference values to the respective storage controllers associated with the first energy storage and the second energy storage,
wherein the calculating the respective reference values comprises calculating the respective reference values based on the obtained respective participation factors and the obtained respective states of charge.

12. An electrical microgrid comprising the network controller of claim 11 and the respective storage controllers.

13. The method of claim 2, wherein the obtaining of the respective participation factors includes obtaining the respective participation factors for current control mode and/or for voltage control mode of the microgrid.

14. The method of claim 2, wherein the obtaining of the respective participation factors includes receiving the respective participation factors from the respective storage controllers and/or from an operating system of the microgrid.

15. The method of claim 2, wherein the measurement indicates that the microgrid has been islanded.

16. The method of claim 2, wherein the measurement indicates lower frequency system oscillations from the active power injection from the first energy storage or from the reactive power injection from the second energy storage.

17. The network controller of claim 11, wherein the instructions are further configured to cause the network controller to receive the information, obtain the respective participation factors, obtain the respective states of charge, calculate the respective reference values, and send the respective reference values when the microgrid is islanded.

18. The electrical microgrid of claim 12, wherein each respective storage controller of each of the plurality of energy storages comprises:
a second processor;
a second memory coupled to the second processor and storing a second set of instructions configured to cause the second processor to:
control the associated energy storage based on a pre-set reference value;
receive the respective calculated reference value from the network controller;
receive information about a second measurement made at a local location;
adjust the pre-set reference value based on both the received respective calculated reference value and the received second measurement information; and
control the associated energy storage based on the adjusted pre-set reference value.

19. A method of operating a microgrid comprising:
receiving an indication that the microgrid is islanded from an AC grid via a circuit breaker within the microgrid; and
in response to receiving the indication that the microgrid is islanded:
instructing a first storage controller associated with a first energy storage coupled to the microgrid to operate in a grid forming mode, and
assigning a second storage controller associated with a second energy storage coupled to the microgrid to operate in a grid following mode;
obtaining a first state of charge of the first energy storage, and
obtaining a first participation factor of the first energy storage that quantifies a deviation of a frequency measured at a remote location within the microgrid in response to active power injection from the first energy storage, calculating a first reference value based on the first participation factor and the first state of charge of the first energy storage, and sending the calculated first reference value to the first storage controller, wherein the remote location is at the circuit breaker or at a distributed generator operatively coupled to the microgrid; and
obtaining a second state of charge of the second energy storage, and obtaining a second participation factor of the second energy storage that quantifies a deviation of a voltage measured at the remote location in response to reactive power injection from the second energy storage, calculating a second reference value based on the second participation factor and the second state of charge of the second energy storage, and sending the calculated second reference value to the second storage controller, wherein the remote location is different from a location of the first energy storage and a location of the second energy storage.

20. The method of claim 19, further comprising, before calculating the first reference value, sending a first precalculated reference value to the first storage controller, and sending a second precalculated reference value to the second storage controller in response to receiving the indication that the microgrid is islanded.

\* \* \* \* \*